United States Patent
Beck et al.

(10) Patent No.: US 10,662,682 B2
(45) Date of Patent: May 26, 2020

(54) ACCESS SYSTEM FOR A VEHICLE

(71) Applicant: Huf Hülsbeck & Fürst GmbH & Co. KG, Velbert (DE)

(72) Inventors: Andreas Beck, Bochum (DE); Serdal Bitirim, Velbert (DE); Martin Witte, Ahaus (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 0 days.

(21) Appl. No.: 16/121,669

(22) Filed: Sep. 5, 2018

(65) Prior Publication Data
US 2019/0071898 A1    Mar. 7, 2019

(30) Foreign Application Priority Data
Sep. 5, 2017  (DE) .................. 10 2017 120 393

(51) Int. Cl.
| | |
|---|---|
| *G07C 9/00* | (2020.01) |
| *E05B 85/16* | (2014.01) |
| *E05B 79/06* | (2014.01) |
| *E05B 81/78* | (2014.01) |
| *H03K 17/945* | (2006.01) |
| *E05B 81/76* | (2014.01) |

(52) U.S. Cl.
CPC .............. *E05B 81/77* (2013.01); *E05B 85/16* (2013.01); *G07C 9/00944* (2013.01); *E05B 79/06* (2013.01); *E05B 81/78* (2013.01); *G07C 9/00309* (2013.01); *G07C 2209/65* (2013.01); *H03K 2017/9455* (2013.01); *H03K 2217/96038* (2013.01)

(58) Field of Classification Search
CPC .......... E05B 81/78; E05B 85/16; E05B 49/00; G07C 9/00; B05B 19/00; B60R 25/10; H03K 17/945

USPC ................. 340/5.75, 5.7, 5.72; 70/278.1, 264
See application file for complete search history.

(56) References Cited

U.S. PATENT DOCUMENTS

| | | | | |
|---|---|---|---|---|
| 6,431,643 | B2 * | 8/2002 | Grey .............. | B60N 2/002 105/354 |
| 7,091,836 | B2 * | 8/2006 | Kachouh ......... | E05B 81/14 307/10.1 |

(Continued)

FOREIGN PATENT DOCUMENTS

| | | |
|---|---|---|
| DE | 102016112418 | 1/2017 |
| WO | WO 2018/091199 | 5/2018 |

OTHER PUBLICATIONS

Europäischer Recherchenbericht und die Stellungnahme zur Europäischen Recherche [European Search Report and the European Search Opinion] dated Jan. 30, 2019 From the European Patent Office Re. Application No. 18192445.7 and Its Summary in English. (8 Pages).

*Primary Examiner* — Nam V Nguyen

(57) ABSTRACT

The invention relates to an access system (200) for a vehicle (3), in particular for activating an electric lock (2) of the vehicle (3), comprising:
- at least one actuation sensor (30), by means of which a first inductance detection (110) can be performed for the detection of an activation action,
- at least one information sensor (35), by means of which a second inductance detection (120) can be performed, so that an additional information on the activation action can be determined, whereby the detection of the activation action can be verified.

26 Claims, 5 Drawing Sheets

(56) References Cited

U.S. PATENT DOCUMENTS

| | | | | |
|---|---|---|---|---|
| 7,861,460 B1* | 1/2011 | Costello | ............... | E05F 15/72 |
| | | | | 180/281 |
| 9,353,557 B2* | 5/2016 | Sanborn | ............... | E05B 85/14 |
| 9,834,964 B2* | 12/2017 | Van Wiemeersch | .... | E05B 85/14 |
| 9,932,761 B2* | 4/2018 | Hamada | ............... | E05B 85/20 |
| 2003/0029210 A1* | 2/2003 | Budzynski | ............ | E05B 85/10 |
| | | | | 70/278.1 |
| 2005/0057047 A1 | 3/2005 | Kachouh et al. | | |
| 2009/0256677 A1* | 10/2009 | Hein | ............... | B60R 25/00 |
| | | | | 340/5.72 |
| 2015/0329347 A1* | 11/2015 | Veldhi | ............... | F25D 23/126 |
| | | | | 141/1 |
| 2017/0306662 A1* | 10/2017 | Och | ............... | E05B 85/10 |

\* cited by examiner

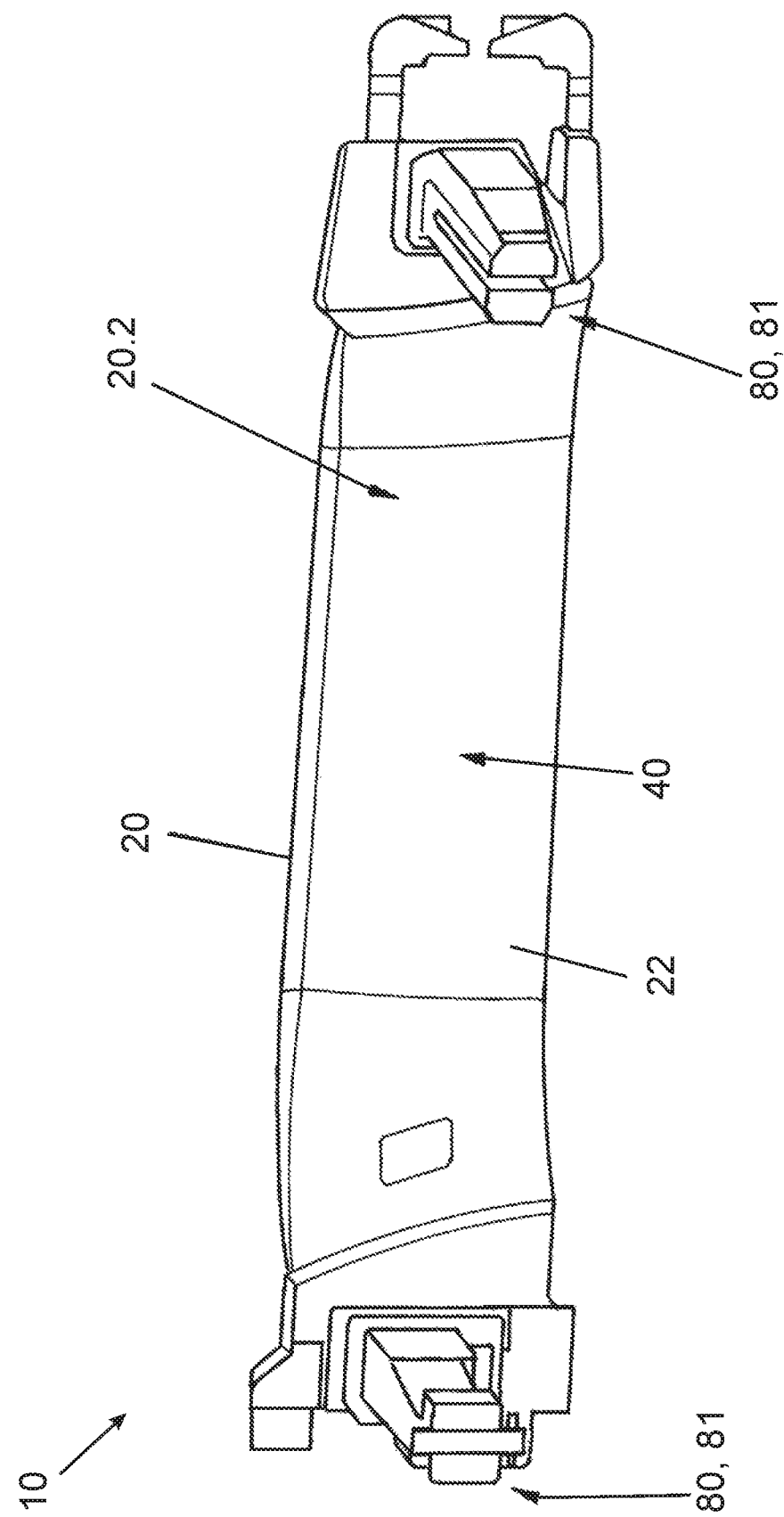

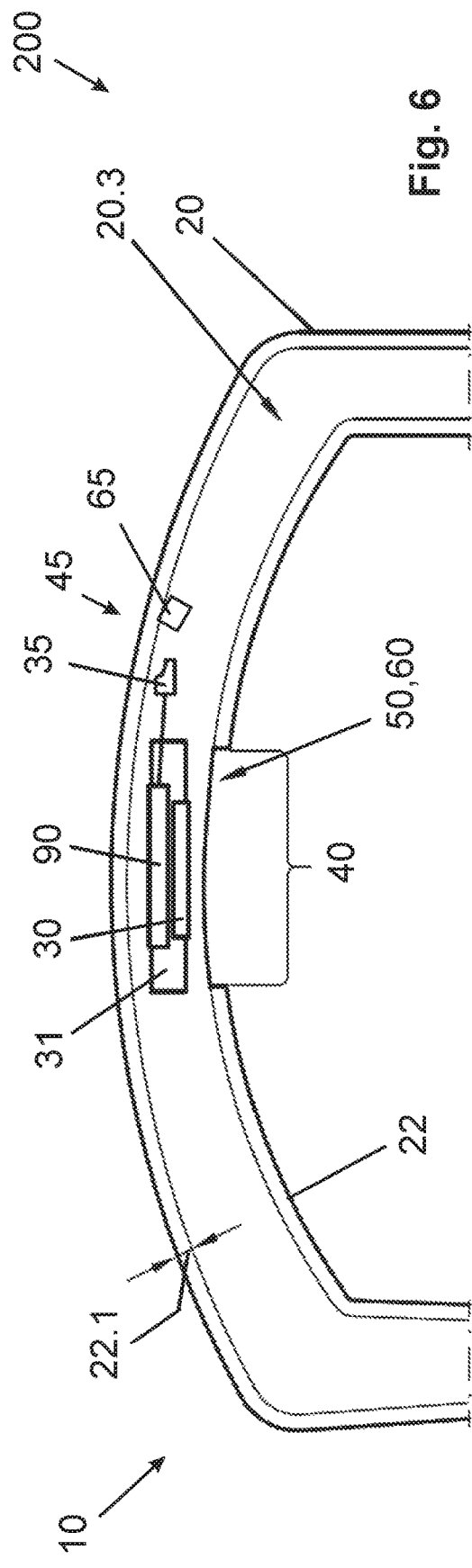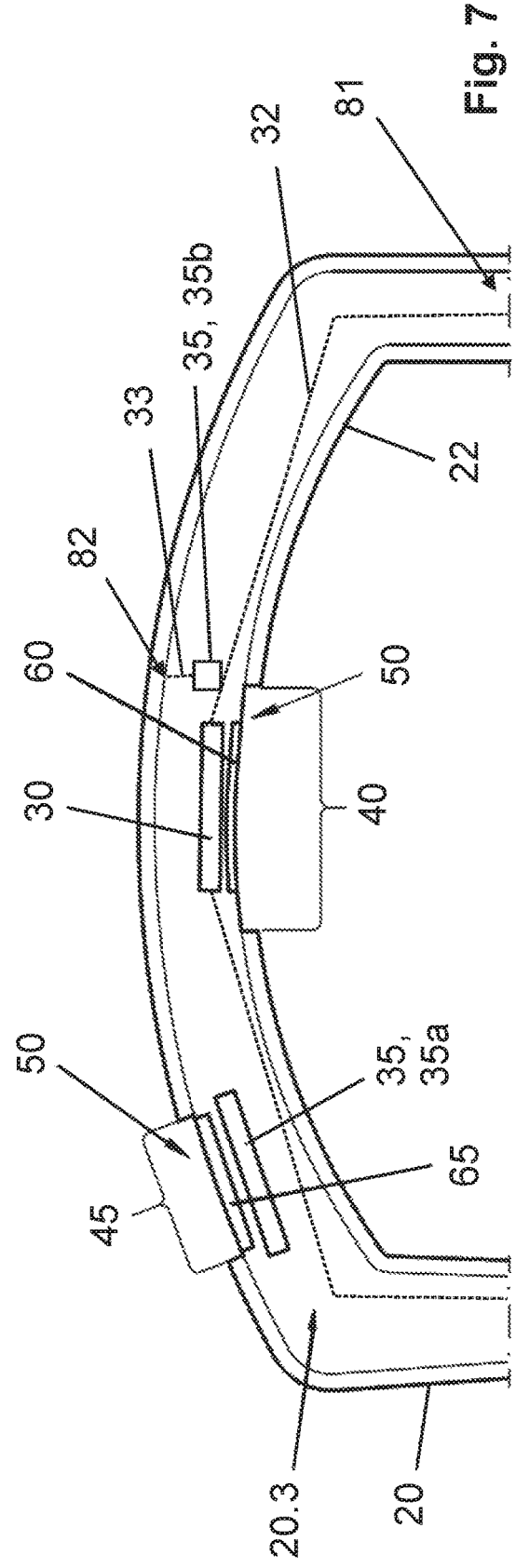

ACCESS SYSTEM FOR A VEHICLE

RELATED APPLICATION

This application claims the benefit of priority of German Patent Application No. 10 2017 120 393.1 filed Sep. 5, 2017, the contents of which are incorporated herein by reference in their entirety.

FIELD AND BACKGROUND OF THE INVENTION

The present invention relates to an access system for a vehicle, in particular for activating a vehicle function. Furthermore, the invention relates to a method for a vehicle.

It is known from the prior art that touch and/or pressure-sensitive sensors as well as proximity sensors can be provided in an access system of a vehicle. Such sensors can be used in a door handle of a vehicle, for example, to detect an activation action, such as a touching of the door handle. Most of the pressure sensors are accessible from outside to implement a successful detection. In response to a detection by the corresponding sensor, a vehicle function can be activated, e.g. an activation of an electronic lock. Thus, opening the door can be made possible intuitively by the touch or the pulling on a door handle of a door, for example. Capacitive sensors are often used to that end.

Disadvantageous with the known solutions is that the evaluation of the detection of the sensors is elaborate and technically complex. In particular, interfering factors such as environmental impacts (e.g. vehicle movements or vibrations on the vehicle) can complicate the evaluation. It is also to be ensured that the sensor is not triggered erroneously in the event of an accident. Security devices of complex mechanical structure are often used to that end.

SUMMARY OF THE INVENTION

It is therefore an object of the present invention to at least partially resolve the above-mentioned disadvantages. In particular, it is an object of the present invention to provide an improved access system which offers a more secure and/or more reliable and/or more comfortable and/or simpler possibility to detect an activation action. In particular, erroneous triggering and detections of the sensor are to be prevented in a technically simple and cost-favorable manner.

The above object is achieved by means of an access system having the features of the independent system claim, and by means of a method having the features of the independent method claim. Further features and details of the invention result from the respective dependent claims, the description and drawings. Features and details described in conjunction with the access system according to the invention naturally also apply in conjunction with the method according to the invention, and vice versa, so that mutual reference is or can be made to the individual aspects of the invention in any case with respect to the disclosure.

The object is particularly achieved by an access system for a vehicle, preferably for a motor vehicle and/or an electric vehicle and/or a passenger car and/or a self-driving (autonomous) vehicle. In particular, the access system serves to activate a vehicle function, preferably for the activation of at least one electric lock, for example an electromechanical lock, of the vehicle. The respective lock can be assigned, for example, to a moveable part such as a door of the vehicle, in order to enable the opening of the moveable part, and thus access to the vehicle for an operator, by the activation. In particular, one condition for the activation is that an activation action is successfully detected and/or that a successful authentication of the operator took place and/or the like. For example, authentication is effected through a communication with a mobile identification transmitter (ID transponder), wherein in particular an exchange of code is performed here. Alternatively or additionally, at least one further vehicle function of the vehicle can be provided and/or activated by the access system, for example depending on the detection of the activation action and/or the authentication. This allows a comfortable, secure and versatile control of functions of the vehicle.

It can be provided that the access system comprises at least one actuation sensor (e.g. arranged inside a door handle body), by means of which a first inductance detection for detection, in particular detecting, of an activation action can be carried out. Furthermore, the access system may include at least one information sensor, by means of which a second inductance detection can be performed, so that an additional information to the activation action can be determined, whereby the detection of the activation action is plausible. The verification can thereby enable to determine the correctness of the detection of the activation action. A positive confirmation of the detection of the activation action thus requires the successful verification of the detection. Especially in the case that the first inductance detection only apparently detected an activation action, which can be caused by interfering factors, for example, the verification causes a corresponding correction. This can significantly improve security and reliability in operation of the access system.

Preferably, the second inductance detection differs from the first inductance detection in terms of the detection region. For example, the additional information is detected independently (e.g. temporally and/or physically) of the activation action. It can likewise be possible that different inductances or different changes of the inductivities can be detected by the inductance detection. It can thus be possible, for example, that an activation action has a significant effect on the first inductance detection (so that a significant change in inductivity is detected), but not on the second inductance detection (so that the second inductance detection is not significant to the activation action). In other words, due to the first inductance detection a change of an inductance change can be detected, which is specific to the activation action, whereas the second inductance detection is intentionally non-specific to the activation action. This provides the advantage that an check (verification) of the detection of the activation action can be effected in a simple and reliable manner.

The invention is based, in particular, on the idea that multiple sensors (i.e. at least one actuation sensor and at least one information sensor) are used to detect one (single) activation action, in particular. In particular, the respective sensors can be evaluated separately from one another by corresponding sensor channels, in particular signal channels. Preferably, the information sensor or the sensor channel of the information sensor is used to detect a background noise level and/or a basic movement of the vehicle (and thus e.g. environmental impacts). The second inductance detection can thus be configured in particular for the detection of interfering factors of the activation action. Because often these interfering factors, which are detected by the information sensor, also have an influence on the first inductance detection of the actuation sensor. The latter is used to detect the activation action, in order to enable the detection. In particular, a verification of the detection can be effected in a very simple manner by a comparison of the results of the first and the second inductance detection.

Preferably, the detection of an inductance change by both sensors to a similar extent indicates that no actual activation action exists, and thus the detection of the actuation sensor action is not plausible. If, however, the (first) inductance detection of the actuation sensor is significantly different from the (second) inductance detection of the information sensor, an activation action may possibly be concluded therefrom.

For example, the activation action includes a deforming of a part of the vehicle, e.g. of a door handle, preferably of a fixed door handle, preferably in an activation region. In particular, this deformation can cause an inductance change specific to the activation action. In this case, the actuation sensor can be arranged adjacent to the activation region in such a way that this inductance change has an influence on the first inductance detection. In addition, the information sensor can be arranged in such a way (e.g. adjacent to the actuation sensor) that this change in inductance due to the activation action does not have a significant influence or only little influence on the second inductance detection, or at least has a different effect on it. This enables a reliable verification of the detection, in particular by a comparison between the first and second inductance detection.

It is optionally possible here that sensor signals of the respective sensors (i.e. of the actuation sensor and of the information sensor) are evaluated at regular intervals simultaneously or time-shifted, wherein the respective evaluation is effected, for example, in time intervals in the range from 1 µs to 5 s, preferably 10 µs to 3 s, preferably 100 µs to 1 s, particularly preferably 500 µs to 800 µs. Thus, a fast and comfortable activation of the access system can be enabled.

It can also be possible that the information sensor is configured as a toggle transponder which causes a switching of an evaluation mode for the actuation sensor and/or for the detection of the activation action. It is, for example, conceivable that a high level of interfering factors can be concluded from a detection of a significant inductance change of the information sensor. In this case, for example if the measuring values of the second inductance detection exceed a threshold value, the evaluated mode can be switched from a first mode ("sensitive") to a second mode ("non-sensitive). Accordingly, the evaluation of the first inductance detection in accordance with the evaluation mode can be effected in such a way that e.g. other threshold values are used for the detection of the activation action. Accordingly, in the scope of the invention, "verification" can also be understood as such an influencing of the detection or evaluation.

The actuation sensor and the information sensor can be of the same type and/or identical sensors with respect to the sensor specifications, so that a cost reduction is possible in particular when using the same components. Furthermore, it is also possible that different sensors are provided, for example in order to increase the sensitivity of the information sensor. For example, the sensitivity to vibrations of the information sensor may be increased. Alternatively or additionally, a higher sensitivity of the information sensor can also be achieved by the arrangement and/or mounting of the information sensor, which is configured more motion-sensitively, than that of the actuation sensor. According to another advantage, the mounting of the information sensor (as the case may be, by contrast with the actuation sensor) can not be effected statically, but instead in a suspended manner (e.g. on a wire) or (e.g. via spring elements) freely and/or elastically moveably, for example. In particular, the information sensor can be connected to a spring element which serves to mount the information sensor on the vehicle (in particular in an internal space of the door handle) and, as the case may be, connects the information sensor to the vehicle (or door handle body). This allows a simple and reliable detection of interfering factors.

Optionally, the access system according to the invention is not limited to two sensors. Yet further actuation sensors and/or information sensors can be provided, as required. The actuation sensors can be configured for (redundant) detection of identical activation actions or each be configured for the detection of different actuation actions, e.g. also on different positions and/or on different moveable parts and/or different door handles of the vehicle. Preferably, the respective actuation sensors can be arranged on these different positions in order to detect the respective activation action. Just as well, the information sensors can each be configured for the verification of these respectively identical or different detections, and be arranged on different positions of the vehicle accordingly. The respective actuation and/or information sensors can be arranged on or in a door handle and/or on or in a moveable part and/or adjacent thereto, for example on a vehicle body, and/or on or in a door handle carrier and/or on or in the lock and/or on or in the controller for the door handle, respectively. The moveable part is e.g. a door or tailgate of the vehicle. For example, the respective sensor can likewise be arranged behind a vehicle trim and/or behind a sheet metal, in particular a vehicle door, or the like (e.g. independently of a door handle), so that said sensor is arranged to be not visible from outside the vehicle.

Optionally, it is possible that the access system includes at least one door handle with a door handle body (in particular a door handle carrier), wherein the door handle body is configured with an activation region, so that the activation action can be carried out at the door handle body by an operator. For example, the activation region is formed in that it (by contrast with the region adjoining it) permits a (in particular defined) deformation when applied with force. This is for example achieved in that a wall (in particular of the door handle body) has a structural adjustment in the activation region such as a certain, predetermined thickness, and is thus different from the wall adjacent thereto. For example, the application of force can be caused by the activation action, in particular by a touch. This allows a detection of the actuation action which can be detected in a simple manner, as well as a comfortable realization of the same.

Furthermore, it can be possible that the door handle is formed as a (in particular fixed) external door handle of the vehicle, and is preferably attached to the vehicle in a non-moveable manner, in particular on a moveable part (such as a door or a tailgate) of the vehicle, wherein preferably the activation region is configured as a deformation region, and particularly preferably the door handle body is formed to be elastically deformable at least in the activation region. The configuration as an activation or deformation region can be effected, for example, in that a wall of the door handle body is configured to be thinner in the deformation region or has a structural adjustment compared with the neighboring wall of the door handle body. This allows the provision of a defined deformability for the reliable detection of the activation action.

Furthermore, it is possible that at least one activation region is provided on the vehicle, in particular on at least one door handle of the vehicle, in which the activation action can be performed by the application of a force, so that by the application of force, a deformation (e.g. of a vehicle part such as a wall of a door handle body) can be caused in the activation region, wherein preferably the actuation sensor is arranged adjacent to the activation region, in particular fixed, and is preferably directed to the activation region, so that the deformation can be detected by the first inductance detection. For example, the activation region is formed as a region of the vehicle part, such as a region of the door handle body. In particular, an activation means can be provided in the activation region, which supports the inductance change during the deformation. For example, the actuation sensor is arranged at a distance from the wall of the door handle body in the activation region and/or from an activation means in the activation region by at most 50 μm, or at most 500 μm, or at most 1 mm, or at most 5 mm, or at most 50 mm. The activation means is formed from a metal, for example, so that it is capable of causing a change of inductance.

It can optionally be possible that an (electronic) processing device is provided, e.g. a microcontroller or the like, which is in an operational electric connection with the actuation sensor and the information sensor (e.g. cable-bound or via radio) in such a way that for the detection of the activation action, the activation action can be detected by a (first) evaluation (by the processing device) of the first inductance detection, and the verification of the detection of the activation action can be performed by a (second) evaluation (by the processing device) of the second inductance detection. This enables a simple and fast detection of the activation action, in particular by the processing device. To that end, the processing device can be electrically connected to the central vehicle electronics and/or a controller of the door and/or the like, for example. For example, the processing device can also be a part of the central vehicle electronics or the like, and is thus preferably integrated in the vehicle electronics. The processing device can also be a part of a controller for the door or for the lock. In particular, the processing device is electrically connected to a circuit board and/or arranged thereon, wherein preferably also at least one of the sensors is electrically connected to this circuit board or arranged thereon.

Furthermore, it can be advantageous in the scope of the invention if the at least one actuation sensor and/or the at least one information sensor are each configured as an LDC sensor and/or as an inductive sensor or the like, in particular as an (LDC) coil, so that preferably the respective sensor is configured to measure inductivity. The abbreviation LDC stands for "Inductance to Digital Converter". The at least one sensor particularly serves to (indirectly) measure a deformation and/or relative movement and/or a touch of a neighboring vehicle part, such as a wall of the door handle body in the deformation region or information region. As a result, the deformations can reliably be detected or the interfering factors can be recognized.

Preferably, the at least one actuation sensor and/or the at least one information sensor each serves, in particular as an LDC sensor, for the detection of at least one change of an inductivity, i.e. in particular for measuring inductance. Different components and/or circuits are typically required to that end, which in particular in an LDC sensor are integrated on one chip, or in an integrated circuit. The LDC sensor is configured, for example, to measure the impedance and the resonance frequency of an LC circuit at the same time. In this case, the sensor is preferably non-susceptible to external impacts such as moisture or pollution in the deformation region or information region. As a result, an erroneous detection caused by factors, such as rain, that lead to malfunctioning with, for example, capacitive sensors can be prevented. An erroneous detection due to external impacts causing an application of force on to the vehicle part can be reduced, in particular, by a (second) evaluation of the information sensor. A threshold value or the like can be determined by this (second) evaluation, for example. In particular, a (first) evaluation of the actuation sensor can be effected based upon the threshold value in order to suppress interfering factors. The threshold value thus serves for verification of the detection of the actuation sensor. The LDC sensor has e.g. a resolution of below one micron (of a distance change measured based upon a detection of inductance) with a bit depth for quantization of the measured inductance values of at least 16 bit or at least 24 bit.

It is also conceivable in the scope of the invention that the information sensor is configured as a crash sensor for the vehicle. In an accident, high accelerations may occur on the vehicle, which thus cause (e.g. due to the deformation) a change of inductance in the first and/or second inductance detection. By the detection and/or evaluation of a correspondingly strong inductance change by the information sensor, the accident, or at least an interference, can be detected and be discriminated from the activation action. This enables to verify the first inductance detection correspondingly, so that the positive detection of the activation action can be prevented in an accident. In particular, the detection of a significant inductance change and/or a high frequency of the inductance change of the second inductance detection effects that the successful detection of the activation action is blocked and, as the case may be, security functions of the vehicle are activated (e.g. a locking of the lock or the like).

Furthermore, it can be provided in the scope of the invention that the actuation sensor comprises a first signal channel and the information sensor comprises a second signal channel wherein the first signal channel is different from the second signal channel, so that in particular the actuation sensor can be evaluated independently by the second signal channel via the first signal channel, and preferably the information sensor can be evaluated via the second signal channel independently of the first signal channel. In particular, two different signals can be used and, possibly, also be evaluated simultaneously, so that a fast and reliable verification is possible. The use of separate signal channels also allows a secure evaluation, so that even in a failure for example of one of the signal channels, the evaluation of the other signal channel is still possible. This is also relevant, for example, when using the information sensor as a crash sensor, wherein, as the case may be, the positive detection of an activation action (i.e. in particular the activation of a vehicle function depending thereon) is prevented in a failure of the second signal channel and/or of the information sensor in any case.

In particular, it can be provided that the respective signal channel is configured as a logic channel, wherein the corresponding signals are transmitted, e.g. physically, via a (common) transmission means, such as an electric cable. To that, likewise a multiplexing method can be used for the different signals, for example. Alternatively, the respective signal channel can also be configured as a physical (electric/electronic) channel, wherein a first signal channel physically separated from the second signal channel is then formed e.g. as an electric line. It is also conceivable that the actuation sensor and/or the information sensor are configured separately from the respective signal channels, so that the actuation sensor is electrically connected (and possibly disconnectable from) to the first signal channel, and/or the information sensor is electrically connected to the second signal channel.

Furthermore, it can be possible that the information sensor comprises yet a further function (besides the verification), which is provided by the second inductance detection. Such a further function can be e.g. a temperature detection or the provision of an information about a movement and/or deformation in the vehicle. This provides the advantage that a significant reduction of costs is possible by the multifunctionality.

Another advantage can be achieved in the scope of the invention if the information sensor is arranged (in particular fixed) to be moveable on a door handle, in particular in an internal space of the door handle, wherein preferably the information sensor is mounted to be moveable relative to a wall of a door handle body of the door handle. In particular, the mounting moveable relative to the wall is effected in such a way that the relative movement (of the information sensor to the wall) possible on average can be discriminated from a standstill (of the information sensor relative to the wall) significantly by means of the second inductance detection of the information sensor. For example, at least 5 or at least 10 or at least 20 or at least 100 steps (i.e. correspondingly different extensions or thicknesses) of the relative movement can be detected and/or discriminated by the second inductance detection. In this way, such a relative movement possible on average, which includes at least a change of a relative distance of the information sensor to the wall in the range from 1 μm to 500 μm (preferably 11 μm to 1000 μm), can be discriminated from a standstill or such a relative movement with a maximum change of the distance in the range from 0.1 μm to 10 μm. In particular, the relative movement is a vibration, in particular of the information sensor, which correspondingly causes the temporal change of the distance.

It is also advantageous, if at least one or at least two further information sensors are provided, wherein all information sensors are arranged in such a way on and/or in a door handle body and/or on the vehicle that the second inductance detection and corresponding further inductance detections of the further information sensors can be performed in the respective detection regions, wherein preferably the detection regions are (physically) different from one another. For example, the detection regions can be provided spaced apart from one another on the vehicle, for example at a distance of at least 10 cm or at least 20 cm or at least 1 m. Thus, even different influencing factors can be detected and used for verification.

Further, it is conceivable in the scope of the invention that a door handle having a door handle body is provided, wherein the door handle comprises at least one inductive and/or metal activation means, which is arranged in an activation region of the door handle body, wherein preferably the door handle body is formed to be deformable in the activation region, so that an influencing of the activation means can be caused in the activation region by the activation action (in particular with respect to the position of the activation means relative to the door handle body). Preferably, the detection region of the information sensor can be located outside or at least partially inside the activation range. For example, the influencing occurs in that the position of the activation means is changed, i.e. the activation means is moved relative to the door handle body. An inductance change can be caused thereby, which can be detected by the first inductance detection. This enables a simple and reliable detection of the activation action.

It can be advantageous if the information sensor, in the scope of the invention, is arranged on the vehicle, in particular outside a significant influence by the activation action (on the inductance detectable by the information sensor), in such a way that an interfering factor of the detection in particular the detection of the activation action can be detected by the second inductance detection. For example, it can be provided that the information sensor is arranged on the vehicle outside the door handle, in particular on a moveable part of the vehicle, preferably on a door of the vehicle, and preferably is mounted to be moveable relative to the moveable part. In particular, the door handle is also arranged on the moveable part, in order to enable an opening of the moveable part.

It is further conceivable that an information region is provided, in particular on a door handle and/or on a moveable part, wherein the information sensor is arranged adjacent and/or directed to the information region in such a way that a deformation and/or movement in the information region (e.g. also a relative movement between the information sensor and the information region, e.g. by a movement or vibration of the information sensor per se) can be determined by the second inductance detection, wherein preferably the information region is arranged at a distance from an activation region for the activation action. In particular, the distance between the activation region and the information region can be at least 1 cm, or at least 10 cm, or at least 100 cm. It can thereby be ensured that the activation action will not influence on the second inductance detection, in order to this way enable a reliable detection of interfering factors.

Preferably, the information region includes at least one, in particular inductive and/or metal, information means. For example, the information region is arranged at least partially inside or completely outside the activation region (of the actuation sensor).

Preferably, the information means and/or the activation means is/are configured to change its inductance value upon a deformation of the information means and/or of the information region or of the activation means and/or the activation region. Preferably, the change of the inductance value can (also) be caused in that a distance of the information means or activation means to the information sensor or actuation sensor changes due to an application of force on to the information region or the activation region (by the activation action).

Furthermore, it can be possible in the scope of the invention that the actuation sensor is arranged inside the door handle body (in other words in an internal space of the door handle, wherein the internal space is at least partially delimited by the door handle body), and preferably is arranged at a distance from an activation means of the door handle body for the detection of the activation action in such a way that a deforming of the door handle body (in the activation region) specific to the activation action is detectable by the first inductance detection, in particular by means of a measuring of an inductance on the activation region. This can achieve the advantage that the extent of the inductance change due to the activation action can be adjusted and intensified, as required, by the activation means, so that a detection is possible with a sufficient sensitivity.

Furthermore, it can be possible that the information sensor is arranged inside the door handle body (in particular in an interior space of the door handle), and is preferably arranged spaced from an activation means and/or an information means of the door handle body in such a way that a deformation of the door handle body and/or application on to a door handle body by the second inductance detection—non-specific for the activation action—can be detected, in particular by a measuring of an inductance at the activation region. For example, the activation means is used both by the information sensor and by the actuation sensor in order to detect the inductance change due to the application or deformation in the activation region and/or information region. However, the information means can be formed independently of the activation means, e.g. physically spaced from it. In particular, the information sensor detects—similar to the actuation sensor—an inductance, in particular of the activation means or the information means, respectively.

In particular, it is provided for the detection of the sensors that at least one inductive, in particular metal, element is provided in the activation region and/or information region (respectively), for example an activation means or an information means. The activation means and/or the information means may comprise a metal element or a metal layer or a metal strip or a chrome layer, for example. Thus, the wall may not cause any significant inductance change in the activation region or in the information region, which wall is formed mainly from plastics, for example. Thus, in such a case, an activation means can be provided in the deformation region, in particular on or in the wall. Furthermore, the activation means and/or the information means can preferably be arranged on the internal side (i.e. facing the vehicle interior) or on the external side (facing away from the vehicle interior or facing the external area of the vehicle) of the wall.

It is likewise possible that at least one of the sensors is respectively configured for inductance measuring on a respective inductive activation means or information means. In particular, the activation means can be arranged in the (respective) activation region, so that preferably a deformation can be detected in the respective activation region by means of the first inductance detection, in particular inductance measuring, in order to detect the activation action and/or activate at least one vehicle function dependent upon the inductance detection. For example, each of the activation means or information means can respectively be assigned to one of the sensors, and to that end be arranged relative to the respectively assigned sensor at a predetermined distance, for example. The distance must, in particular, be selected such that in case of a movement of the activation means or information means, respectively, an inductance change occurs in a manner to be detectable for the respective sensor. The inductance change is, in particular, also caused in that the distance for the corresponding sensor to the activation means or information means changes. In the information means, this change is, in particular, caused by interfering factors, whereas the activation means is configured to perform a movement relative to the actuation sensor upon a manual deformation by an operator.

In particular, it can be possible that the successful (positive) and thus also successfully verified detection of an activation action triggers at least one vehicle function, wherein preferably the vehicle functions include at least one of the following functions:
  an unblocking or opening of at least one door of the vehicle, in particular by an activation of an electric lock of the door,
  a controlling a central lock of the vehicle,
  an unblocking or opening at least one tailgate of the vehicle, in particular by an activation of an electric lock of the door,
  a wake-up signal for a (central) vehicle lock,
  an initiation of an authentication process,
  an unblocking or opening of at least one glove compartment of the vehicle, in particular by an activation of an electric lock of the glove compartment, an activation of a vehicle lighting system,
  a control of a movement of the vehicle, e.g. of a driving direction and/or for the initialization of a stop of the vehicle, e.g. for a maneuvering and/or automatic parking function of the vehicle,
  performing an emergency stop in the vehicle.

Furthermore, it is optionally provided that the actuation sensor is mounted on a first mounting point and that the information sensor is mounted on a second mounting point, in particular on a door handle and/or on a moveable part of the vehicle, such, that the information sensor has a larger (in particular higher and/or high-frequency) movement range relative to the second mounting point than has the actuation sensor relative to the first mounting point, so that the actuation sensor is formed to be less susceptible to vibration than the information sensor. For example, a high-frequency movement range is provided, which enables vibration, for example. In particular, the information sensor is intentionally configured to be susceptible to vibration, in order to detect interference in a better manner as a result. Preferably, a second processing device can be provided for evaluation of the second inductance detection, wherein this evaluation is intentionally configured to be susceptible to vibration.

In particular, it can also be possible here that the information sensor is connected to its (second) mounting point via an elastic connection (in particular an elastic holding means), so that a movement of the information sensor relative to the mounting point is possible. In particular, this movement can occur in at least one or two different (e.g. orthogonal) planes. For example, the holding means can be configured as a spring element. This enables, in a simple manner, to provide a higher vibration susceptibility of the information sensor.

Furthermore, it is conceivable that the first actuation sensor is mounted on a door handle by means of a fixed bearing, and the information sensor is mounted differently in the area of the door handle, preferably by means of a loose bearing. In this way, the information sensor can be configured specifically for the detection of interfering factors.

The present invention also relates to a method for a vehicle, in particular for activating an electric lock and/or another vehicle function of the vehicle. In particular, at least an actuation sensor and at least an information sensor are used here, and are attached on the vehicle, for example.

It is particularly provided that at least one of the following steps is performed, wherein preferably the steps are performed one after the other or in any order or at least partially also simultaneously, wherein preferably individual steps can also be performed repeatedly:
a) detecting a deformation (in particular of a door handle body of a door handle) by means of a first inductance detection of the actuation sensor,
b) detecting an activation action of an operator by a first evaluation of the first inductance detection,
c) determining an additional information to the activation action by a second inductance detection of the information sensor, in particular before and/or in and/or after step a),
d) verifying the detection of the activation action by a second evaluation based upon the additional information, in particular prior to step b) of after step b), preferably in such a way that a positive detection of the activation action is performed dependent upon the additional information, so that particularly the detection according to step b) is positively confirmed, or the positive detection is prevented.

The method according to the invention provides the same advantages as have been described in detail with reference to an access system according to the invention. In addition, the method can be suitable to operate an access system according to the invention.

According to another advantage, it can be provided that interfering factors on the detection (in particular on the detection by the first inductance detection) of the activation action, and/or environmental impacts, preferably a background noise level and/or a basic movement of the vehicle, are determined by means of the second inductance detection. This enables a particularly reliable detection of the activation action.

Furthermore, it is optionally provided that the verification according to step d) is effected in such a way that a threshold value for the first evaluation for detection is defined based upon the second inductance detection (e.g. by the second evaluation). The said threshold value can be considered, for example, by the processing device, in order to detect the activation action in a rapid and secure manner. To that end, at least one measuring value of the first inductance detection is compared with the threshold value in order to determine whether an activation action is present or not. As the case may be, further evaluations can be effected alternatively or additionally for verification, e.g. an averaging of the measuring values, a statistical analysis, or the like.

It is furthermore conceivable, that a temperature and/or a deforming and/or a vibration, in particular by measuring a change in inductivity, is determined by the second inductance detection. This allows for the provision of further functions in a simple manner, which functions are, as the case may be, also used for verification or for further vehicle functions.

It is furthermore conceivable that the first evaluation of the first inductance detection is influenced dependent upon the second inductance detection, wherein, in particular, the first evaluation is effected in accordance with a first evaluation type if the additional information fulfills a first criterion, and the first evaluation is effected in accordance with a second evaluation type if the additional information fulfills a second criterion. For example, the first and second criterions can be determined by the definition of threshold values. Thus, the first evaluation type may correspond to a first evaluation mode, in which a normal susceptibility for the detection of the activation action is assumed. If, for example, intense interfering factors are present, which are detected by the second inductance detection, the first evaluation type can be switched to a second evaluation type (according to a second evaluation mode). In this second evaluation type, the susceptibility for detection of the activation action can be reduced. The first criterion, e.g. a first threshold value for the interfering factors, indicates e.g. a low influence of the interfering factors, and the second criterion, e.g. a second threshold value for the interfering factors, may indicate a high influence of the interfering factors. It is also conceivable here that the evaluation of the threshold values and/or switching is effected in the context of the second evaluation and influences the first evaluation of one or more actuation sensors, for example. The first evaluation is performed e.g. dependent upon the evaluation type.

Furthermore, the second evaluation can preferably also be effected temporally before and/or during and/or after the first evaluation and/or the second inductance detection can be effected temporally before and/or during and/or after the first inductance detection. The first and/or second criterion is for example determined in that at least one threshold value and/or at least one tolerance range and/or at least one state change is determined. The change of state includes, for example, the activation of a first state (so that the first criterion is met), in which the first evaluation is normally carried out, and thus also an activation action can be positively detected. For example, the second change of state also includes a second state (so that the second criterion is met), in which the second evaluation is carried out in such a way that the positive detection of the activation action is prevented. In this case, e.g. the additional information indicates a strong vibration on the vehicle, e.g. a crash, so that advantageously an activation of a lock or the like can be prevented. Thus, the security in operation of the vehicle can significantly be increased.

It can preferably be provided in the scope of the invention that, upon a positive (successful) detection of the activation action, an opening of an electric lock is initiated, wherein the opening is blocked in particular dependent upon the second inductance detection, in particular in the case of a crash and/or upon a detection of interfering factors by the second evaluation above a tolerance range. The tolerance range can be predefined, for example, so that a simple detection of interfering factors is possible.

It is optionally possible in the scope of the method according to the invention that a first signal of the actuation sensor on a first signal channel is separately evaluated by the first evaluation from a second signal on the second signal channel by a second evaluation, wherein preferably a first signal depends upon a first inductance detection and a second signal depends upon a second inductance detection. This enables to further improve security in operation of the vehicle by the separation of the signal channels.

Furthermore, it can be advantageous in the scope of the invention that an envelope and/or a course and/or a statistic information (by a statistic analysis) of a second signal of the information sensor are evaluated for the detection of interfering factors and/or environmental impacts, and preferably a first signal of the actuation sensor is directly or indirectly compared with the second signal and/or the result of the second evaluation for the detection of the activation action. For example, the processing device can be used to that end, in order to enable a fast and simple detection.

BRIEF DESCRIPTION OF THE SEVERAL VIEWS OF THE DRAWINGS

Further advantages, features and details of the invention result from the following description describing exemplary embodiments of the invention in detail with reference to the drawings. Here, the features mentioned in the claims and in the description can each per se or in any combination be essential to the invention. The Figures show in:

Identical reference characters will be used for the same technical features even in different exemplary embodiments throughout the drawings.

DESCRIPTION OF SPECIFIC EMBODIMENTS OF THE INVENTION

Figure 1:
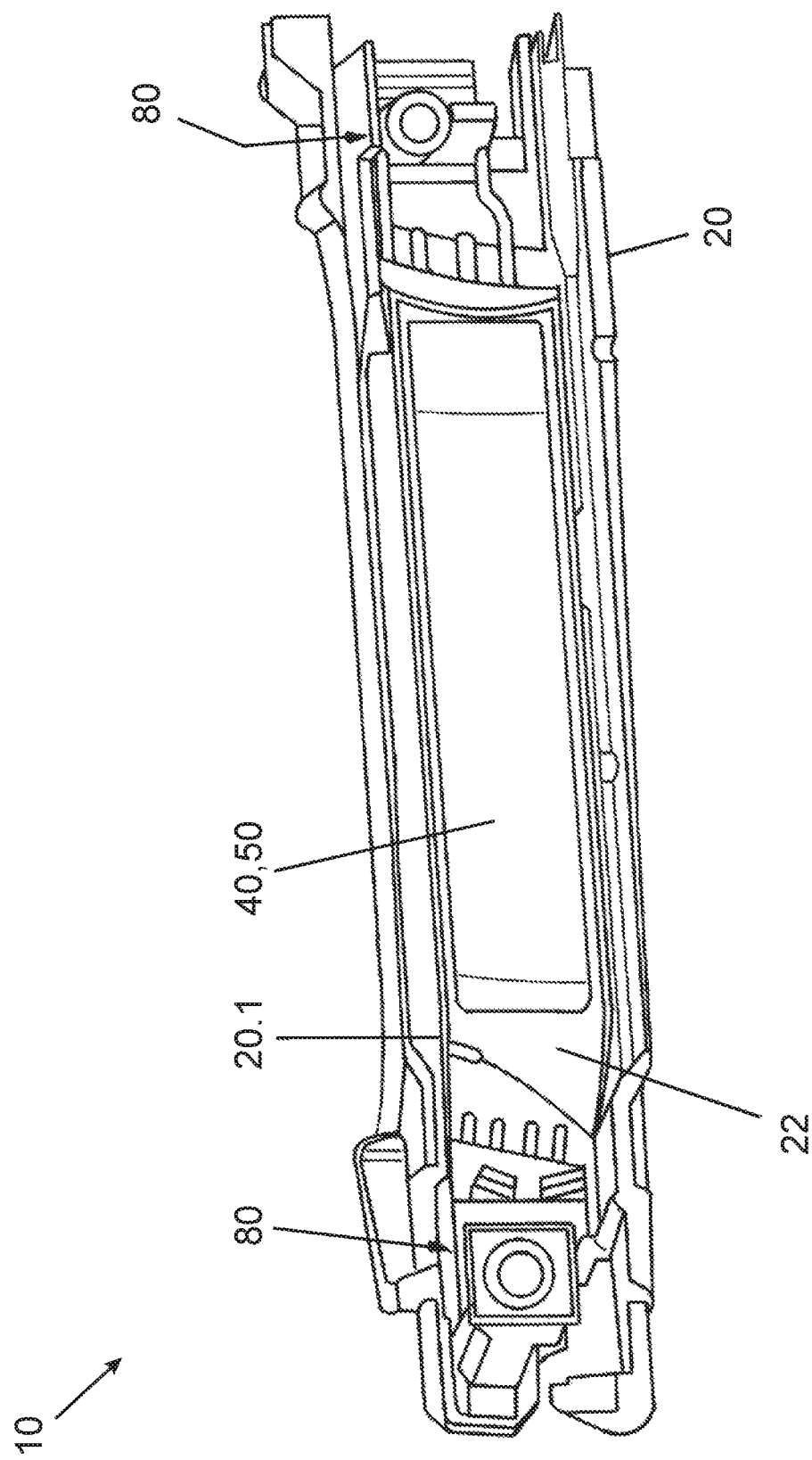
FIG. 1 a schematic representation of parts of an access system according to the invention, wherein a front side of a door handle body is shown in a perspective view, FIG. 2 a schematic representation of parts of an access system according to the invention, wherein a rear side of a door handle body is shown in a perspective view, FIG. 3 a further schematic representation of an access system according to the invention, FIGS. 4+5 schematic arrangements of parts of an access system according to the invention, FIGS. 6+7 schematic representations in a sectional view through a door handle body, FIG. 8 a schematic representation of an arrangement of parts of an access system according to the invention, FIG. 9 a schematic representation for the visualization of a method according to the invention.

FIG. 1 schematically shows parts of a door handle 10 of an access system 200 according to the invention. The said handle includes, inter alia, a door handle body 20, which is shown in a perspective front view. Thus, the side of the door handle body 20 facing away from the vehicle door can be discerned here. The shown door handle 10 is not yet in the final-mounted state in FIG. 1. Thus, an internal side 20.1 of the door handle body 20 is also discernable, which in the mounted state is not discernable from outside. Furthermore, storage points 80 or storage points 80 for the door handle body 20 are shown. The door handle body 20 further includes a wall 22, wherein the door handle body 20 is at least partially formed as an injection-molded part or the like and/or is formed from plastics.

It can be possible here that an actuation of the door handle 10 is effected by a (small) application of force on to the door handle 10 by an operator 5. This application of force can occur through an activation action, e.g. a slight touch by a hand or a finger of the operator 5. In particular, the activation action takes place in an activation region 40 of the door handle 10. Since a detection of the activation action is particularly based upon a detection of a deformation on the door handle 10, the activation region 40 can preferably be formed as a deformation region 40, which permits an (at least slight and maybe elastic) deformation upon an application of force. To that end, the deformation region 40 is formed with a structural adjustment 50, for example.

FIG. 2 schematically shows a rear view of the door handle body 20, wherein an external side 20.2 of the door handle body 20 can be seen. This external side 20.2 can at least partially delimit a door handle recess in the mounted state. It can also be possible that (e.g. in a fixed door handle) such a recess is not provided and/or the door handle body 20 deviates from the geometry shown. Likewise shown are storage points 80 of the door handle 10, hereinafter also referred to as first storage points 81. Moreover, the activation region 40 is shown, wherein the activation action can be carried out e.g. by the operator 5 engaging behind the door handle 10 (i.e. a gripping into the handle recess). It can also be possible that the touch on another point of the door handle 10, e.g. on the front side, is sufficient to perform the activation action.

Figure 3:
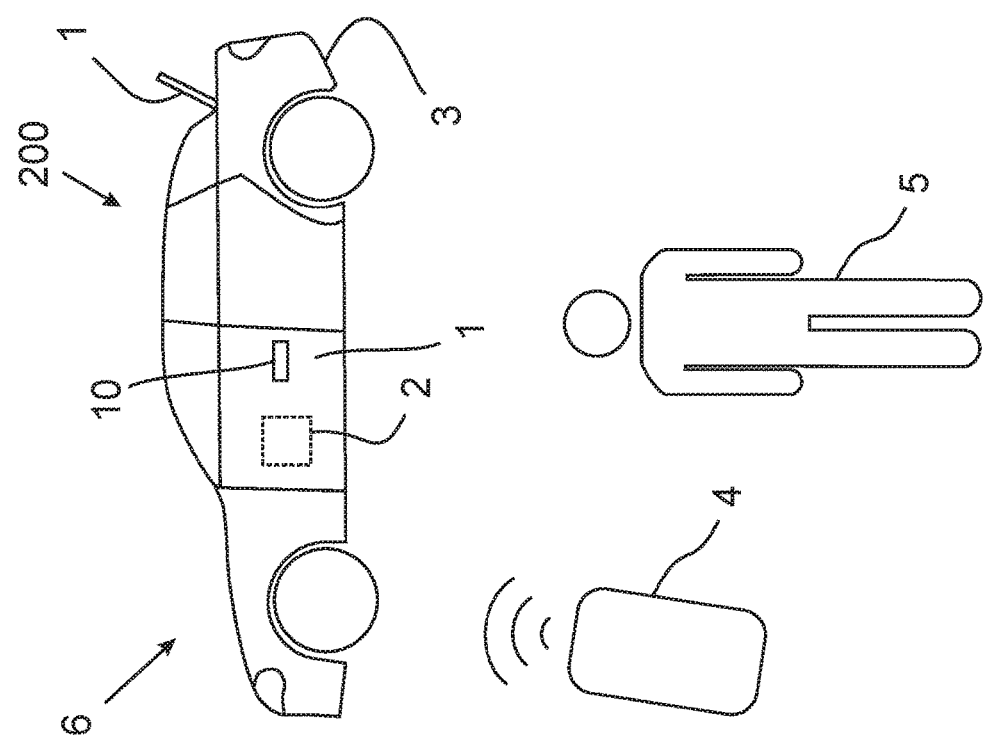

FIG. 3 shows a vehicle 3 with a door handle 10, in particular an external door handle 10. Furthermore, moveable parts 1 of the vehicle 3 are shown in an exemplary manner, in particular a door and a tailgate. Schematically shown is also an electric lock 2 of a security system 6 of the vehicle 3, which is configured, for example, to prevent an opening of at least one of the moveable parts 1 in the closed state or to permit it in the opened state. For example, in order to permit access to the vehicle 3, an operator 5 of the vehicle 3 can use an electronic key (ID transponder 4) in order to perform an authentication. This can, for example, be effected by a manual actuation of the ID transponder 4, or automatically when the ID transponder 4 approaches the vehicle 3. In particular, authentication can also be triggered in that the activation action is detected (positively). In order to now open one of the moveable parts 1, for example, the operator 5 can perform the activation action on the door handle 10 of the corresponding moveable part 1. In a successful authentication and detection, the opening of the lock 2 can be initiated.

Figure 4:
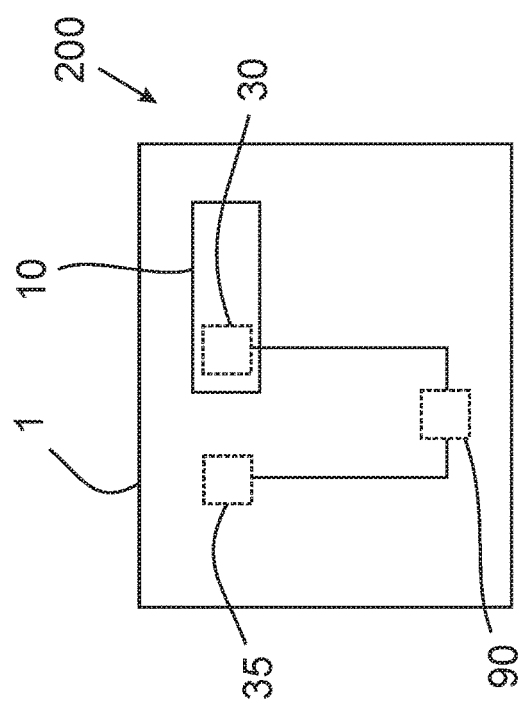
Figure 5:
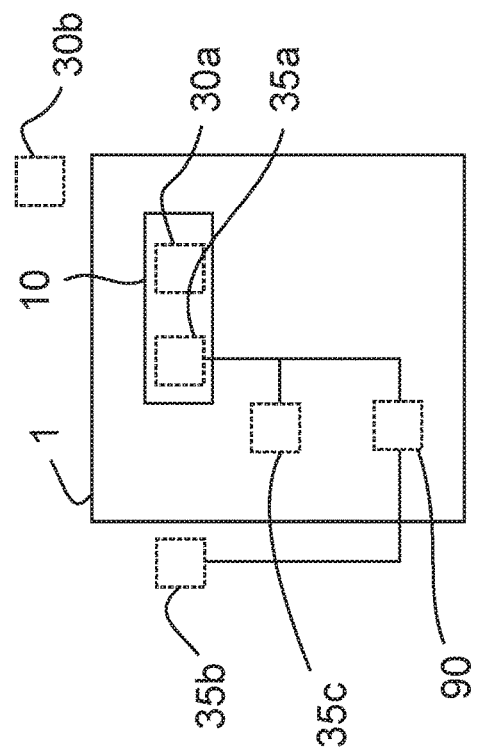

FIGS. 4 and 5 schematically show that in each case at least one actuation sensor 30 and/or in each case one information sensor 35 can be arranged on the moveable part(s) 1 of the vehicle 3. The actuation sensor 30 serves in particular for the detection of an activation action. The information sensor 35 particularly serves for the detection of factors interfering with the detection, in order to improve reliability of the detection. For example, the actuation sensor 30 is arranged on or in the door handle 10. As the case may be, the information sensor 35 can also be arranged outside the door handle 10 and/or outside the moveable part 1 on the vehicle 3. It can be seen in FIG. 4 that both the actuation sensor 30 and the information sensor 35 can be connected to a processing device 90, electrically or via radio.

It is shown in FIG. 5 that it is likewise possible that multiple actuation sensors 30 and information sensors 35 are provided on the vehicle 3, in particular in each case for the activation of an electric lock 2 of a certain moveable part 1. Thus, e.g. a first actuation sensor 30a can be arranged on the door handle 10 to monitor an activation region 40 on the door handle 10. A second actuation sensor 30b can be arranged e.g. outside of the door handle 10 and/or outside the moveable part 1, to detect an activation action outside of the door handle 10 or of the moveable part 1. Furthermore, a first information sensor 35a can be arranged on the door handle 10, a second information sensor 35b can be arranged outside the door handle 10 and outside the moveable part 1, and a third information sensor 35c can be arranged outside the door handle 10 and on the moveable part 1. In particular, these sensors can be connected to a common processing device 90, electrically or via radio. This enables a comprehensive and reliable evaluation of at least one activation action, which can, as the case may be, also be effected outside the moveable part 1 (e.g. adjacent to it on the vehicle 3). Just as well, a comprehensive detection of interfering factors can be performed by the plurality of information sensors 35.

FIGS. 6 and 7 show exemplary arrangements for an actuation sensor 30 and an information sensor 35. The wall 22 of the door handle body 20 can clearly be discerned in the sectional view through the door handle body 20. It is shown here that the said wall has a certain wall thickness 22.1 for the most part, which is greater than the thickness of the wall 22 in the region of an activation region 40, for example. To enable a deformation in the activation region 40, or to improve the detection of this deformation, a structural adjustment 50, such as a recess 50 or a material weakness 50, can be provided in the activation region 40, for example.

The actuation sensor 30 and/or the information sensor 35 can each be arranged in the interior 20.3 of the door handle body 20. For example, a circuit board 31 can be provided, which includes electronics such a processing device 90. In particular, the actuation sensor 30 and/or the information sensor 35 are electrically connected to the circuit board 31 via respective signal channels and/or electric lines and/or the like.

FIG. 6 shows, by way of example, that the actuation sensor 30 can be arranged directly on the circuit board 31. In particular, the actuation sensor 30 is mounted in an immobile manner, so that a relative movement between the actuation sensor 30 and the circuit board 31 or the door handle body 20 (outside the activation region 40) is at least reduced. The actuation sensor 30 can be arranged, for example, adjacent to the activation region 40, to detect a deformation in the activation region 40. This is made possible in particular in that the actuation sensor 30 (just like the information sensor 35) is configured to perform a detection of inductivity. For example, the actuation sensor 30 and the information sensor 25 are to that end configured as LDC sensors. The activation action causes the deformation and thus a change of inductance, which can correspondingly be detected by the actuation sensor 30. To improve this detection, in particular in order to verify it, an additional information of the information sensor 35 can be used. Said sensor is particularly arranged in such a way that the activation action does not have any significant influence on the inductance detection of the information sensor 35. Thus, the information sensor 35 can be used to detect impacts occurring independently of the activation action on the door handle 10 and/or on the vehicle 3, and which might possibly interfere with the detection of the activation action by the actuation sensor 30. For example, the information sensor 35 is arranged at a distance from the activation region 40 and/or the circuit board 31 in the interior space 20.3. To improve the detection of interfering factors, the information sensor can be mounted moveable in such a way, for example, that a relative movement between the information sensor 35 and the circuit board 31 or the door handle body 20 is possible in any case. Just as well, the detection of interfering factors can be improved in that an information means 65 is provided in the detection region of the information sensor 35. This causes a change of inductance upon a change of the distance between the information sensor 35 and the information means 65, which can be detected by the information sensor 35.

To improve the detection of the activation action, an activation means 60 can additionally be provided in the detection region of the actuation sensor 30. Just as well, this can cause a change of inductance upon a change of the distance between the actuation sensor 30 and the activation means 60, which can be detected by the actuation sensor 30. The activation means 60 can be, e.g. a (metal) coating of the wall 22 in the activation region 40, as shown in FIG. 6. Just as well, a configuration of the activation means 60 as a separate part is conceivable. This is shown schematically in FIG. 7. Moreover, it can be seen in FIG. 7 that the mounting of the actuation sensor 30 can likewise occur independently of the circuit board 31, e.g. by a first (in particular non-elastic, rigid) holding device 32, which connects the actuation sensor 30 to the first mounting point 81 of the door handle 10.

It can further be possible that even multiple information sensors 35 are provided. A first information sensor 35*a* is arranged adjacent to an information region 45 with an information means 65 in FIG. 7. Just as well, a structural adjustment 50 can be provided in the information region 45, to improve the detection of interfering factors.

A second information sensor 35*b* can be connected to a second mounting point 82 on the door handle body 20 via a second (in particular elastic) holding device 33. The second mounting point 82 is configured as a loose bearing, for example, so that the second information sensor 35*b* is mounted to be moveable.

Figure 8:
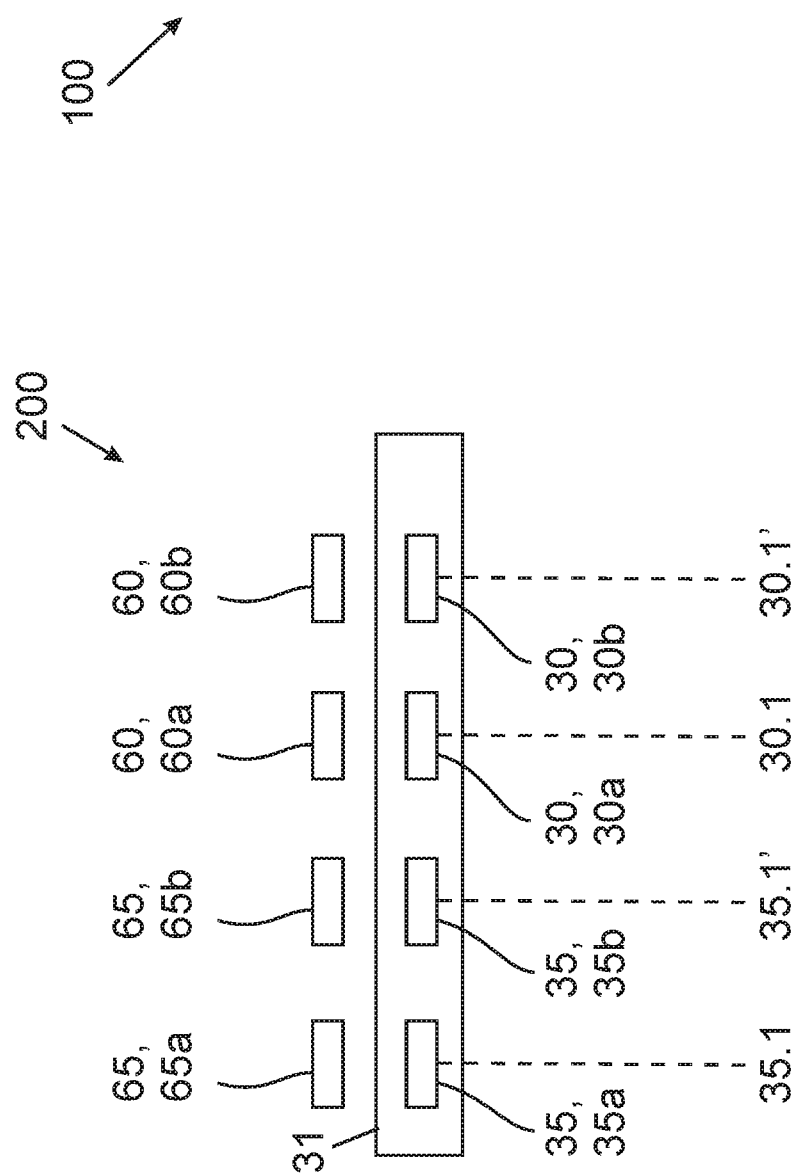

A further possibility for a sensor arrangement is shown schematically in FIG. 8. The circuit board 31 is shown here, on which a first information sensor 35*a* and a second information sensor 35*b* as well as a first actuation sensor 30*a* as well as a second actuation sensor 30*b* are arranged, in particular fixed in a non-releasable manner. The first actuation sensor 30*a* can be connected to a processing device 90 via a first signal channel 30.1, and the second actuation sensor 30*b* can be connected to the processing device 90 via a further first signal channel 30.1'. The first information sensor 35*a* can be connected to the processing device 90 via a second signal channel 35.1, and the second information sensor can be connected to the processing device 90 via a further second signal channel 35.1'. The separate configuration of the signal channels allows an interference-free and reliable evaluation of the detection signals here.

Furthermore, it is shown here that a first activation means 60*a* can be provided for the first actuation sensor 30*a*, a second activation means 60*b* can be provided for the second actuation sensor 30*b*, a first information means 65*a* can be provided for the first information sensor 35*a*, and a second information means 65*b* can be provided for the second information sensor 35*b*, in order to improve the respective detection and increase sensitivity.

Figure 9:
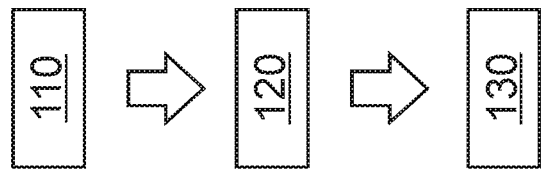

FIG. 9 schematically shows a method 100 according to the invention. First, a detection of a deformation by a first inductance detection 110 of the actuation sensor 30 can be effected here. Subsequently, a detection of an activation action of the operator 5 can be performed by a first evaluation of the first inductance detection 110. Furthermore, a determination of an additional information to the activation action can be performed by a second inductance detection 120 of the information sensor 35, wherein this determination of the additional information can be effected after, during or prior to the first inductance detection 100. Furthermore, the determination of the additional information can be improved in that even further inductance detections 140 are performed, e.g. by further information sensors 35. This enables a verification of the detection of the activation action by a second evaluation based upon the additional information.

The above explanation of the embodiments describes the present invention exclusively by way of example. Individual features of the embodiments can naturally, as far as technically reasonable, be freely combined without departing from the scope of the present invention.

LIST OF REFERENCE CHARACTERS

1 Moveable part
2 Electric lock
3 Vehicle
4 ID transponder
5 Operator
6 Security system
10 Door handle, external door handle
20 Door handle body
20.1 Internal side
20.2 External side
20.3 Internal space
22 Wall
22.1 Wall thickness
30 Actuation sensor
30*a* First actuation sensor
30*b* Second actuation sensor
30.1 First signal channel
30.1' Further first signal channel
31 Circuit board
32 First holding device
33 Second holding device
35 Information sensor
35*a* First information sensor
35*b* Second information sensor 35c Third information sensor
35.1 Second signal channel
35.1' further second signal channel
40 Activation region, deformation region
45 Information region
50 Structure adjustment, recess, material weakness
60 Activation means
60a First activation means
60b Second activation means
65 Information means
65a First information means
65b Second information means
80 Mounting point, bearing point
81 First mounting point
82 Second mounting point
90 Processing device
100 Method
110 First inductance detection
120 Second inductance detection
130 Further inductance detections
200 Access system

What is claimed is:

1. An access system for a vehicle, comprising:
at least one actuation sensor arranged inside a door handle body of a door handle, by means of which a first inductance detection for detecting an activation action can be performed,
at least one information sensor, by means of which a second inductance detection can be performed, so that an additional information to the activation action can be determined,
whereby the detection of the activation action can be checked for plausibility to determine a correctness of the detection of the activation action,
wherein the information sensor is arranged on the vehicle in a location that is sufficiently spaced from the actuation sensor, such that an influence on the information sensor caused by the activation action is less than an influence on the information sensor caused by an external impact on the vehicle occurring independent of the activation action, such that an interference on the detection of the activation action can be detected by means of the second inductance detection.

2. The access system according to claim 1,
wherein the door handle body is configured with an activation region, so that the activation action can be performed at the door handle body by an operator.

3. The access system according to claim 1,
wherein
an activation region is provided on the vehicle, in which the activation action can be performed through an application of force, so that a deforming can be caused in the activation region by the application of force, wherein the actuation sensor is arranged adjacent to the activation region so that the deforming can be detected by the first inductance detection.

4. The access system according to claim 1,
wherein
a processing device is provided, which is in an operational electric connection with the actuation sensor and the information sensor in such a way that for the detection of the activation action, the activation action can be detected by an evaluation of the first inductance detection by the processing device, and can be verified by means of an evaluation of the second inductance detection by the processing device.

5. The access system according to claim 1,
wherein
the actuation sensor and the information sensor are each configured as an Inductance to Digital Converter (LDC) sensor.

6. The access system according to claim 1,
wherein
the actuation sensor comprises a first signal channel, and the information sensor comprises a second signal channel, wherein the first signal channel differs from the second signal channel.

7. The access system according to claim 1,
wherein
the information sensor is configured as a crash sensor for the vehicle.

8. The access system according to claim 1,
wherein
the information sensor is arranged moveably on the door handle.

9. The access system according to claim 1,
wherein
at least one or at least two further information sensors are provided, wherein all information sensors are arranged in such a way at least on or in the door handle body or on the vehicle that the second inductance detection and corresponding further inductance detections of the further information sensors can be performed in respective detection regions, wherein the detection regions are different from one another.

10. The access system according to claim 1,
wherein
the door handle comprises at least one inductive activation means which is arranged in an activation region of the door handle body, wherein the door handle body is designed to be deformable in the activation region, so that an influencing of the activation means can be caused by the activation action in the activation region.

11. The access system according to claim 1,
wherein
the information sensor is arranged on the vehicle in such a way, that an interference on the detection of the activation action can be detected by means of the second inductance detection.

12. The access system according to claim 1,
wherein
the information sensor is arranged on the vehicle outside the door handle.

13. The access system according to claim 1,
wherein
an information region is provided, wherein the information sensor is arranged adjacent to the information region in such a way that at least a deforming or movement in the information region can be determined by the second inductance detection, wherein preferably the information region is arranged at a distance from an activation region for the activation action.

14. The access system according to claim 1,
wherein
the actuation sensor is mounted on a first mounting point, and the information sensor is mounted on a second mounting point, in such a way that the information sensor has a larger movement range in relation to the second mounting point than has the actuation sensor in relation to the first mounting point, so that the actuation sensor is configured to be less susceptible to vibration than the information sensor.

15. The access system according to claim 1,
wherein
the actuation sensor is mounted on the door handle by a fixed bearing, and the information sensor is mounted in the region of the door handle in a different way.

16. The access system according to claim 1,
wherein the access system is configured for activating an electric lock of the vehicle,
and further comprising at least one processing device in an operational electric connection with the actuation sensor and the information sensor, and configured to compare the first inductance detection and the second inductance detection, and thereby verify the detection of the activation action by checking for plausibility to determine a correctness of the detection of the activation action,
wherein the information sensor responds to a change in inductance at or below a threshold value, the actuation sensor responds to a change in inductance above the threshold value, and the processing device is configured to determine a correctness of the detection of the activation action based on whether the first inductance detection is above the threshold value.

17. The access system according to claim 1,
wherein the access system is configured for activating an electric lock of the vehicle,
and further comprising at least one processing device in an operational electric connection with the actuation sensor and the information sensor, and configured to compare the first inductance detection and the second inductance detection, and thereby verify the detection of the activation action by checking for plausibility to determine a correctness of the detection of the activation action,
wherein the processing device is configured to set a threshold value using the second inductance detection of the information sensor, and to compare a measurement value of the first inductance detection of the actuation sensor with the threshold value to determine a correctness of the detection of the activation action.

18. A method for a vehicle, wherein at least one actuation sensor arranged in a door handle body of a door handle and at least one information sensor are provided,
wherein the following steps are provided:
a) detecting a deforming by means of a first inductance detection of the actuation sensor,
b) detecting an activation action of an operator by means of a first evaluation of the first inductance detection,
c) determining an additional information to the activation action by a second inductance detection of the information sensor,
d) verifying the detection of the activation action by checking for plausibility to determine a correctness of the detection of the activation action;
wherein the information sensor is arranged on the vehicle in a location that is sufficiently spaced from the actuation sensor, such that an influence on the information sensor caused by the activation action is less than an influence on the information sensor caused by an external impact on the vehicle occurring independent of the activation action, such that an interference on the detection of the activation action can be detected by means of the second inductance detection.

19. The method according to claim 18,
wherein
at least environmental impacts can be determined by the second inductance detection.

20. The method according to claim 18,
wherein
the verification according to step d) is effected by a processing device in that a threshold value for the first evaluation for detection is determined by means of the second inductance detection.

21. The method according to claim, 18
wherein
at least a temperature or a deforming or a vibration is determined by the second inductance detection.

22. The method according to claim 18,
wherein
the first evaluation of the first inductance detection is influenced dependent upon the second inductance detection, if the additional information meets a first criterion indicating an interference below a certain threshold, and the first evaluation is effected in accordance with a second evaluation type, if the additional information meets a second criterion indicating an interference above the certain threshold, wherein in the second evaluation type, a normal susceptibility for detection of the activation action is reduced.

23. The method according to claim 18,
wherein
in a positive detection of the activation action, an opening of an electric lock is initiated.

24. The method according to claim 18,
wherein
at least an envelope or a course or a statistic information of a second signal of the information sensor are evaluated for the detection of at least interfering factors or environmental impacts, and preferably a first signal of the actuation sensor is directly or indirectly compared with at least the second signal or a result of the second evaluation for the detection of the activation action.

25. The method according to claim 18,
wherein the method is for activating an electric lock of the vehicle,
wherein at least one processing device in an operational electric connection with the actuation sensor and the information sensor is provided,
wherein the at least one processing device performs step b),
wherein the at least one processing device performs step d) by comparing the first inductance detection and the second inductance detection, and thereby verifying the detection of the activation action by checking for plausibility to determine a correctness of the detection of the activation action,
wherein the information sensor responds to a change in inductance at or below a threshold value, the actuation sensor responds to a change in inductance above the threshold value, and the processing device is configured to determine a correctness of the detection of the activation action based on whether the first inductance detection is above the threshold value.

26. The method according to claim 18,
wherein the method is configured for activating an electric lock of the vehicle,
wherein at least one processing device in an operational electric connection with the actuation sensor and the information sensor is provided,
wherein the processing device performs step b),
wherein the at least one processing device performs step d) by comparing the first inductance detection and the second inductance detection, and thereby verifying the detection of the activation action by checking for plausibility to determine a correctness of the detection of the activation action,
wherein the processing device sets a threshold value using the second inductance detection of the information sensor, and compares a measurement value of the first inductance detection of the actuation sensor with the threshold value to determine a correctness of the detection of the activation action.

\* \* \* \* \*